United States Patent
Chen et al.

(10) Patent No.: US 9,167,686 B2
(45) Date of Patent: Oct. 20, 2015

(54) 3D STACKED PACKAGE STRUCTURE AND METHOD OF MANUFACTURING THE SAME

(71) Applicants: UNIVERSAL SCIENTIFIC INDUSTRIAL ( SHANGHAI ) CO., LTD., Shanghai (CN); UNIVERSAL GLOBAL SCIENTIFIC INDUSTRIAL CO., LTD., Nantou County (TW)

(72) Inventors: Jenchun Chen, New Taipei (TW); Hsin Chin Chang, Taipei (TW)

(73) Assignees: Universal Scientific Industrial (Shanghai) Co., Ltd., Shanghai (CN); Universal Global Scientific Industrial Co., Ltd., Nantou County (TW)

(*) Notice: Subject to any disclaimer, the term of this patent is extended or adjusted under 35 U.S.C. 154(b) by 153 days.

(21) Appl. No.: 13/783,161

(22) Filed: Mar. 1, 2013

(65) Prior Publication Data
US 2014/0104799 A1     Apr. 17, 2014

(30) Foreign Application Priority Data
Oct. 17, 2012   (TW)  ................ 101138237 A

(51) Int. Cl.
H05K 7/10     (2006.01)
H05K 7/12     (2006.01)
(Continued)

(52) U.S. Cl.
CPC .......... *H05K 1/0284* (2013.01); *H01L 23/3121* (2013.01); *H01L 23/49811* (2013.01); *H01L 23/5389* (2013.01); *H01L 25/105* (2013.01); *H05K 1/144* (2013.01); *H01L 21/565* (2013.01);
(Continued)

(58) Field of Classification Search
USPC ........... 361/760–790; 257/670–680, 770–790
See application file for complete search history.

(56) References Cited

U.S. PATENT DOCUMENTS 6,472,735 B2 * 10/2002 Isaak ............................. 257/686
8,299,591 B2 * 10/2012 Oh et al. ....................... 257/686
(Continued)

FOREIGN PATENT DOCUMENTS

EP     2651041 A1     7/2012
TW     200522221 A     7/2005
(Continued)

OTHER PUBLICATIONS

France Patent Office, Search Report FR1353153 issued on Feb. 4, 2014.
(Continued)

*Primary Examiner* — Tuan T Dinh
(74) *Attorney, Agent, or Firm* — Foley & Lardner LLP; Cliff Z. Liu; Angela D. Murch

(57) ABSTRACT

A 3D stacked package structure includes a first unit, a molding unit, a conductive unit and a second unit. The first unit includes a first substrate and at least one first electronic component, and the first substrate has at least one runner and at least one first conductive pad. The molding unit includes a top portion, a frame, and at least one connection connected between the top portion and the frame. The conductive unit includes at least one conductor passing through the frame and electrically connected to the first conductive pad. Therefore, the first unit can be stacked on the second unit through the frame of the molding unit, and the first unit can be electrically connected to the second unit through the conductor of the conductive unit.

20 Claims, 9 Drawing Sheets

(51) Int. Cl.
*H05K 1/02* (2006.01)
*H01L 23/498* (2006.01)
*H01L 25/10* (2006.01)
*H01L 23/31* (2006.01)
*H01L 23/538* (2006.01)
*H05K 1/14* (2006.01)
*H01L 21/56* (2006.01)
*H01L 25/16* (2006.01)
*H05K 3/28* (2006.01)

(52) U.S. Cl.
CPC ..... *H01L 25/162* (2013.01); *H01L 2224/16225* (2013.01); *H01L 2225/1023* (2013.01); *H01L 2225/1058* (2013.01); *H01L 2225/1076* (2013.01); *H01L 2924/19105* (2013.01); *H01L 2924/19106* (2013.01); *H05K 3/284* (2013.01); *H05K 2201/042* (2013.01); *H05K 2201/2018* (2013.01); *H05K 2203/1316* (2013.01)

(56) References Cited

U.S. PATENT DOCUMENTS 8,767,409 B2 * 7/2014 Cheng .......................... 361/790
2004/0063246 A1 4/2004 Karnezos
2005/0148113 A1 7/2005 Karnezos
2007/0241437 A1 10/2007 Kagaya et al.
2008/0283992 A1 * 11/2008 Palaniappan et al. ......... 257/686
2010/0148339 A1 * 6/2010 Lopez et al. .................. 257/686
2012/0013007 A1 1/2012 Hwang et al.

FOREIGN PATENT DOCUMENTS

| TW | 200818453 A | 4/2008 |
| TW | 201227922 A | 7/2012 |
| TW | 201232735 A | 8/2012 |
| WO | WO2012096354 A1 | 7/2012 |

OTHER PUBLICATIONS

Office Action and Search Report for Co-Pending Taiwan Application No. 101138237; issued on Oct. 17, 2014; 7 pages.

Office Action (without English Translation) and Search Report (with English Translation) dated Jun. 2, 2015 for ROC (Taiwan) Patent Application No. 101138237. 6 pages.

* cited by examiner

US 9,167,686 B2

3D STACKED PACKAGE STRUCTURE AND METHOD OF MANUFACTURING THE SAME

BACKGROUND OF THE INVENTION

1. Field of the Invention

The instant disclosure relates to a package structure and a method of manufacturing the same, and more particularly to a 3D (three-dimensional) stacked package structure and a method of manufacturing the same.

2. Description of Related Art

With process technologies of integrated circuit (IC) develop rapidly, the integration density of a chip inner circuit increases and an area for the conductive lines decreases. With the reduction of the area of pads and metal wires, continuous improvements of the chip stacked technology are required to adapt for more miniaturized chip.

The stacked package technology (or being called 3D package technology) is used to stack a plurality of chips or a plurality of substrates having a plurality of chips and electronic components, and then electrically connect the chips or the substrates, which can increase over two times density on same chip and becomes the main technique for solving high-density memory presently.

SUMMARY OF THE INVENTION

One of the embodiments of the instant disclosure provides a 3D stacked package structure, comprising: a first unit, a molding unit, a conductive unit and a second unit. The first unit includes a first substrate and at least one first electronic component, wherein the first substrate has at least one runner and at least one first conductive pad. The molding unit includes a top portion, a frame, and at least one connection connected between the top portion and the frame. The conductive unit includes at least one conductor passing through the frame and electrically connected to the first conductive pad. Hence, because the design of the molding unit and the conductive unit, the first unit can be stacked on the second unit through the frame of the molding unit, and the first unit can be electrically connected to the second unit through the conductor of the conductive unit.

Another one of the embodiments of the instant disclosure provides a method of manufacturing a 3D stacked package structure, comprising: placing at least one first unit inside a mold structure, wherein the first unit includes a first substrate and at least one first electronic component disposed on the first substrate, and the first substrate has at least one first conductive pad and at least one runner; filling the mold structure with a molding material to form a molding unit, wherein the molding unit includes a top portion, a frame and at least one connection connected between the top portion and the frame; removing the mold structure; forming at least one opening passing through the frame; filling the opening with a conductor; and then stacking the first unit on a second unit through the frame, wherein the first unit is electrically connected to the second unit through the conductor. Hence, because the design of forming the molding unit and forming at least one conductor, the first unit can be stacked on the second unit through the frame of the molding unit, and the first unit can be electrically connected to the second unit through the conductor of the conductive unit. Moreover, the frame for connecting the first unit with the second unit can be formed conveniently during the step of covering the first electronic component by the top portion, thus the manufacturing process of the instant disclosure can be simplified and the manufacturing cost of the instant disclosure can be reduced.

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention to limit the instant disclosure.

DETAILED DESCRIPTION OF THE PREFERRED EMBODIMENTS

Figure 1:
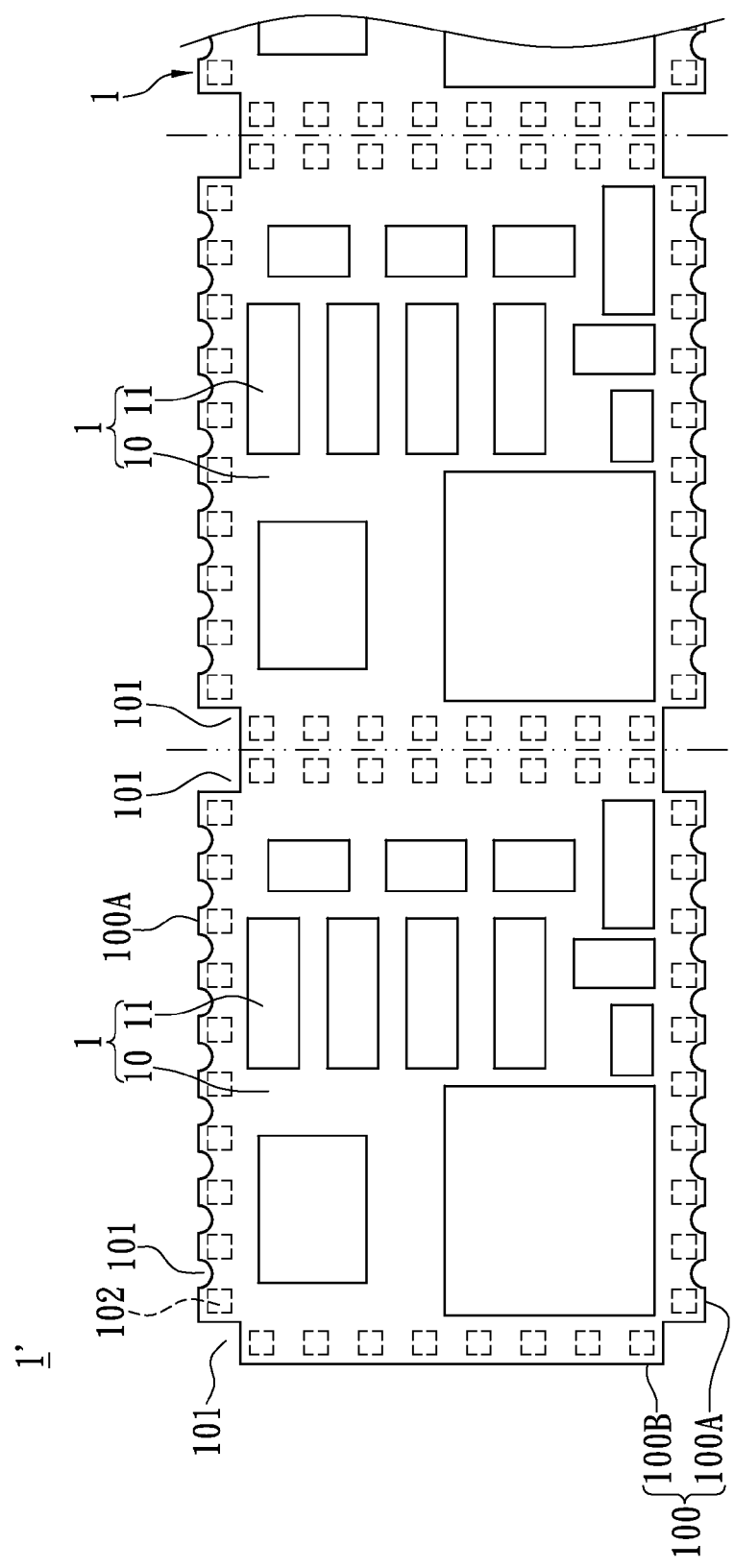
FIG. 1 shows a top, schematic view of the circuit substrate module according to the instant disclosure.

Referring to FIG. 1 to FIG. 4, where the instant disclosure provides a method of manufacturing a 3D stacked package structure, substantially comprising the following steps:

First, referring to FIG. 1, a circuit substrate module 1' including a plurality of first units 1 sequentially connected with each other is provided, where the first units 1 are respectively distinguish from each other by the imaginary lines as shown in FIG. 1. In addition, each first unit 1 includes a first substrate 10 and at least one first electronic component 11 disposed on and electrically connected to the first substrate 10. The instant disclosure uses a plurality of first electronic components 11 as an example. Moreover, the first substrate 10 has at least one runner 101 formed on the periphery 100 thereof and passing through the first substrate 10, and the first substrate 10 has at least one first conductive pad 102 disposed on the bottom surface of the first substrate 10 and adjacent to the periphery 100 of the first substrate 10. The instant disclosure uses a plurality of runners 101 and a plurality of first conductive pads 102 as an example. More precisely, the first substrate 10 has two first lateral sides 100A opposite to each other and two second lateral sides 100B opposite to each other. In addition, each runner 101 is formed on a junction between the first lateral side 100A and the second lateral side 100B adjacent to each other, and the first conductive pads 102 can be arranged as a surrounding shape along the two first lateral sides 100A and the two second lateral sides 100B. Furthermore, the instant disclosure can add a plurality of newly runners 101 formed on the periphery 100 on each corresponding first substrate 10, and each newly runner 101 is formed on two adjacent first conductive pads 102, each first substrate 10 has four larger runners 101 formed on four corners thereof, and the two adjacent larger runners 101 of the two adjacent first substrates 10 can be communicated with each other.

Figure 2:
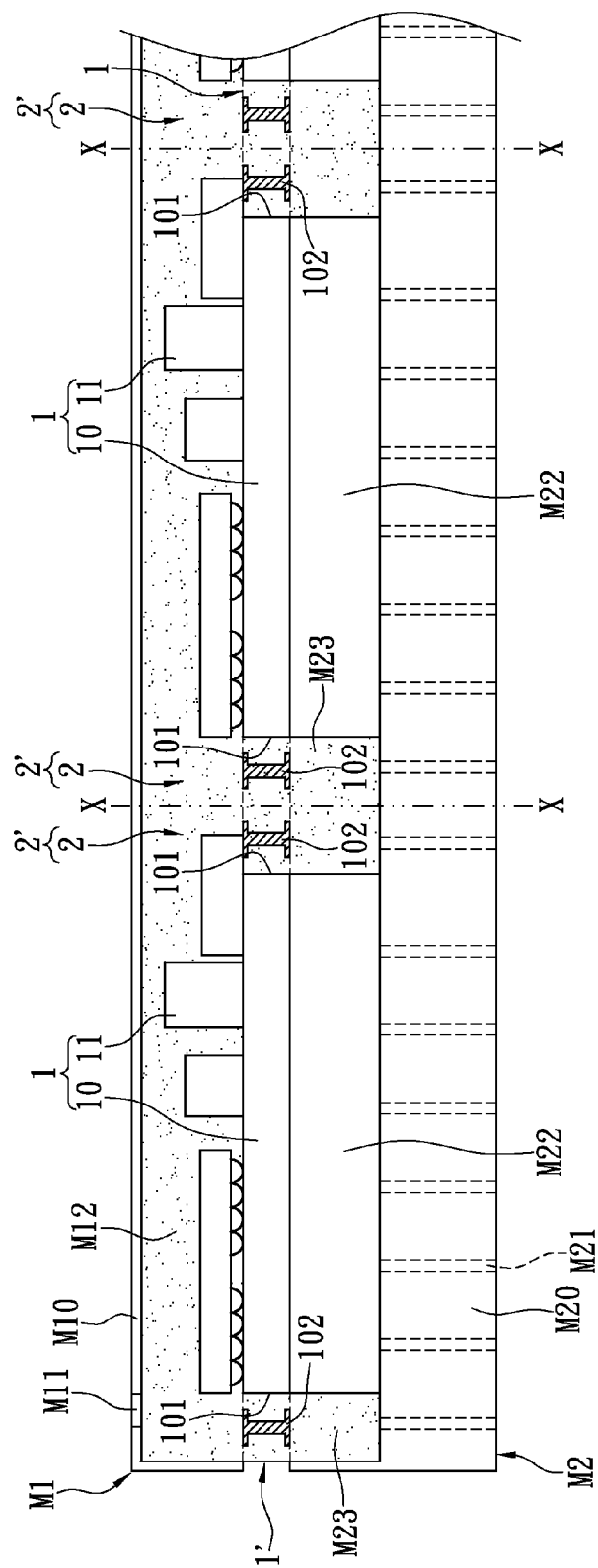
FIG. 2 shows a lateral, schematic view of the circuit substrate module disposed inside the mold structure and filled with the molding material according to the instant disclosure.

Next, referring to FIG. 2, the circuit substrate module 1' is placed between a top mold M1 and a bottom mold M2, and a molding material is filled between the top mold M1 and the bottom mold M2 to form a plurality of molding units 2 sequentially connected with each other and respectively corresponding to the first units 1, where the molding units 2 are respectively distinguish from each other by the cutting lines X-X as shown in FIG. 2, and the top mold M1 and the bottom mold M2 are assembled as a mold structure M. The top mold M1 includes a top casing M10, at least one port M11 passing through the top casing M10, and a receiving space M12 formed in the top casing M10, and the molding material 2' can be poured into mold structure M (i.e., between the top mold M1 and the bottom mold M2) through the port M11. The bottom mold M2 includes a bottom casing M20, a plurality of exhaust runners M21 passing through the bottom casing M20, and a plurality of surrounding runners M23 disposed on a position substantially corresponding to the periphery 100 of the first substrate 10, where the surrounding runners M23 can be communicated with each other and each runner 101 can communicated between the receiving space M12 and the surrounding runner M23. When pouring the molding material 2' into the mold structure M (i.e., between the top mold M1 and the bottom mold M2) through the port M11, bubbles generated by the pouring step can be discharged from the exhaust runners M21 of the bottom mold M2, so as to compactly fill the mold structure M with the molding material 2'. It's worth mentioning that the bottom mold M2 further includes a plurality of blocks M22 disposed between the bottom casing M20 and the circuit substrate module 1' and respectively contacting the first substrates 10, and each block M22 is surrounded by each corresponding surrounding runner M23. Hence, when the first substrate 10 is stacked on a second substrate, each block M22 can be used to form a predetermined receiving space on the top surface of the second substrate for receiving more electronic components. However, the instant disclosure also can use laser scribing to remove the bottom portion of the molding material 2' to form the predetermined receiving space on the top surface of the second substrate without using the design of the blocks M22.

Figure 3A:
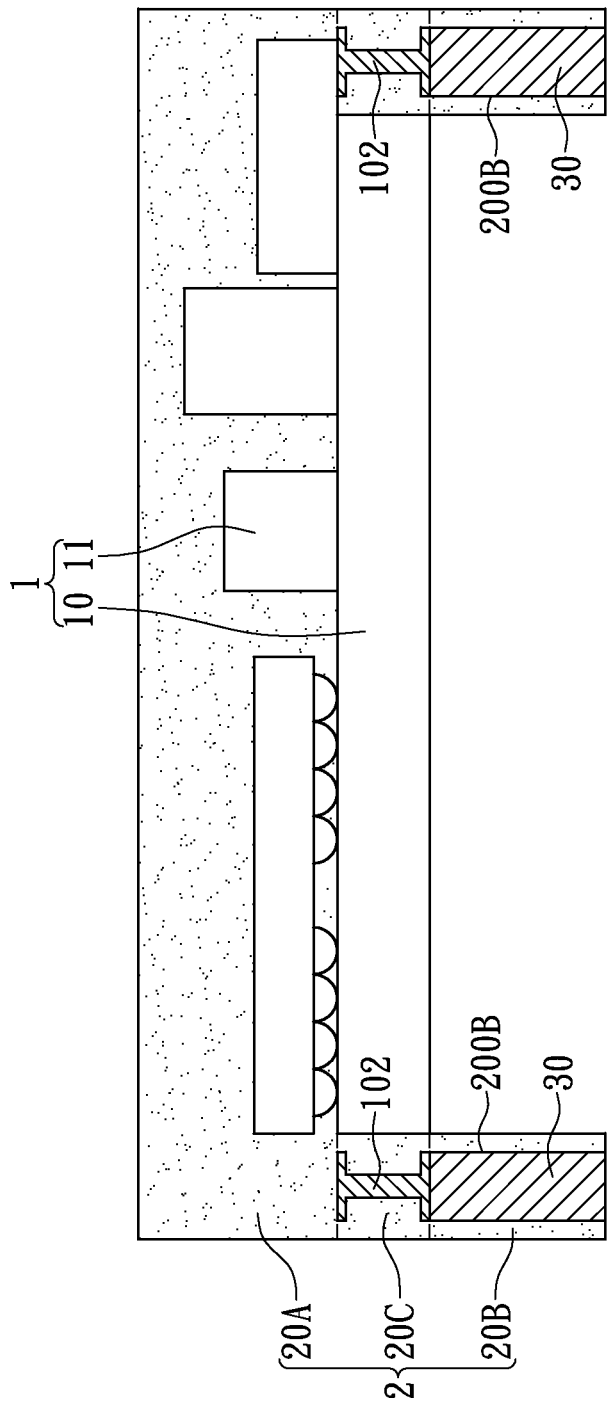
FIG. 3A shows a lateral, schematic view of the openings respectively filled with the conductors according to the instant disclosure.
Figure 3B:
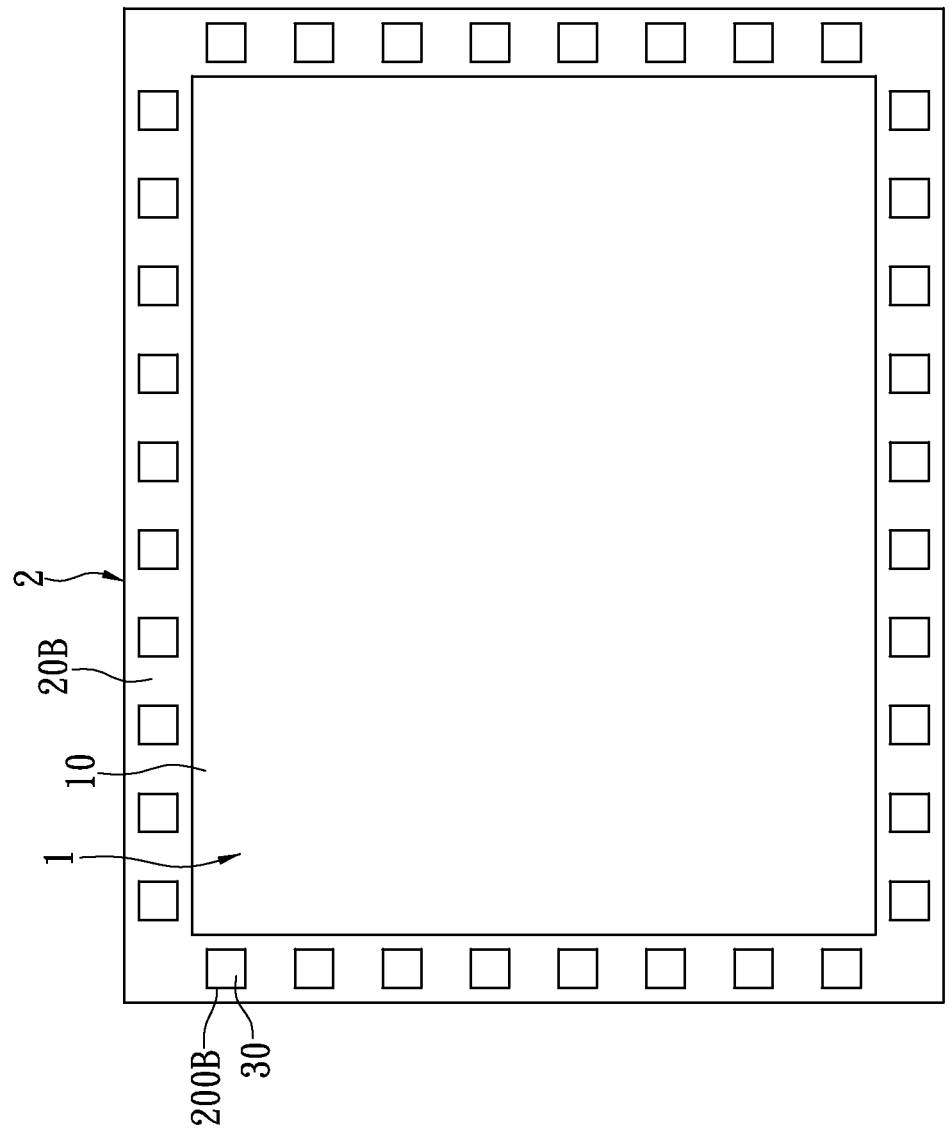
FIG. 3B shows a bottom, schematic view of the openings respectively filled with the conductors according to the instant disclosure.

Then, referring to FIGS. 2, 3A and 3B, where FIG. 3B is a bottom, schematic diagram of FIG. 3A. After removing the top mold M1 and the bottom mold M2, the circuit substrate module 1' and the molding material 2' can be cut along the X-X cutting line of FIG. 2 to form a plurality of first units 1 separated from each other and to form a plurality of molding units 2 separated from each other, where each molding unit 2 includes a top portion 20A covering the first electronic components 11, a frame 20B disposed on the bottom surface of the first substrate 10 and substantially corresponding to the periphery 100 of the first substrate 10, and a plurality of connection 20C disposed inside the runners 101 and concurrently connected between the top portion 20A and the frame 20B. More precisely, the top portion 20A, the frame 20B and the connection 20C can be integrated with each other to form a single piece. In addition, the frame 20B can be formed conveniently during the step of covering the first electronic components 11 by the top portion 20A, thus the manufacturing process of the instant disclosure can be simplified and the manufacturing cost of the instant disclosure can be reduced.

Afterward, the frame 20B is processed to form a plurality of openings 200B corresponding to the first conductive pads 102. For example, the openings 200B can be formed by laser drilling.

Next, the openings 200B can be respectively filled with a plurality of conductors 30, where the conductors 30 can be electrically connected to the first conductive pads 102 of the first unit 1, respectively.

Figure 4:
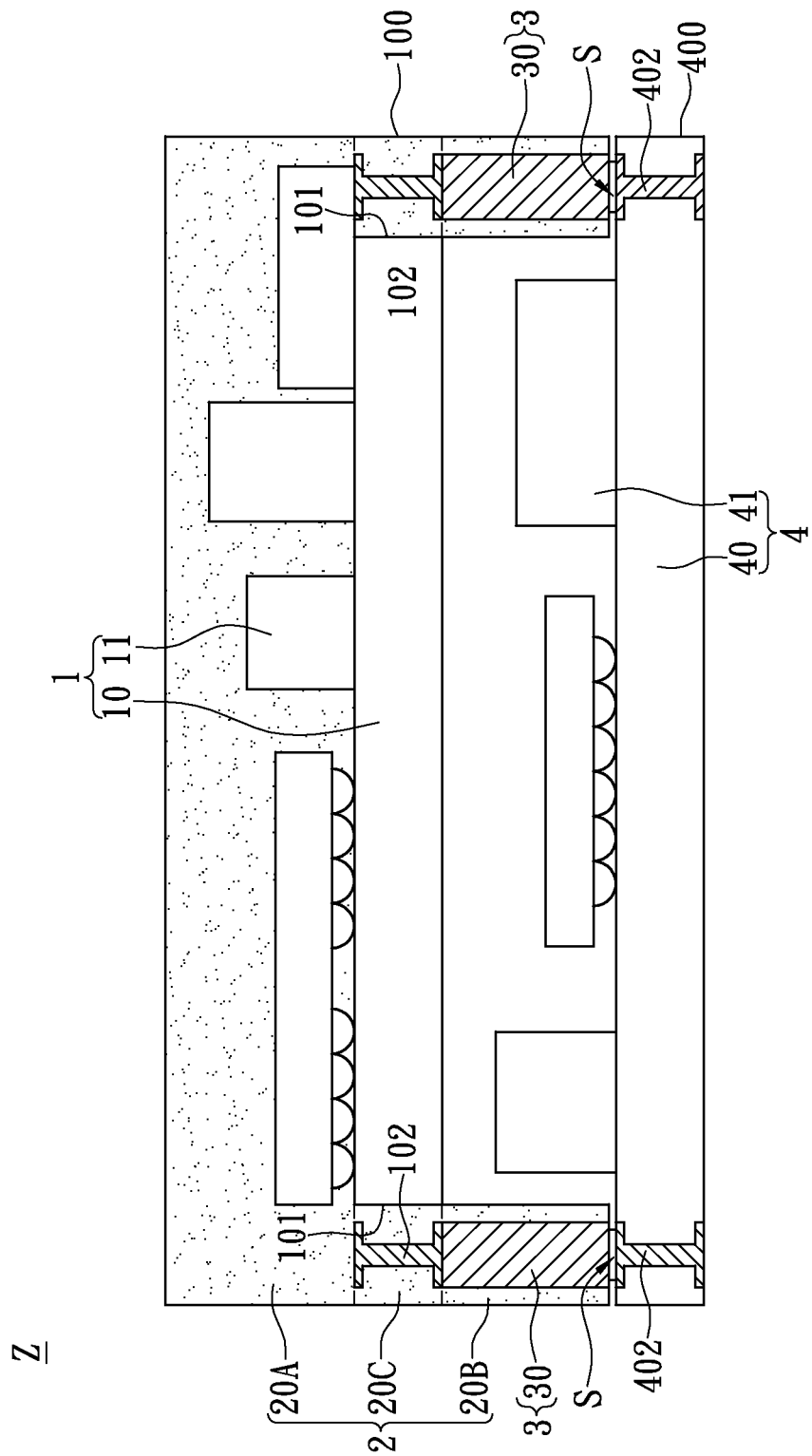
FIG. 4 shows a lateral, schematic view of the 3D stacked package structure according to the first embodiment of the instant disclosure.

Finally, referring to FIG. 4, the first unit 1 is stacked on a second unit 4, where the first unit 1 is electrically connected to the second unit 4 through the first conductive pad 102 and the conductor 30. For precisely, the second unit 4 includes a second substrate 40, a plurality of second electronic pads 402 disposed on the second substrate 40 and adjacent to the periphery 400 of the second substrate 40, and at least one second electronic component 41, and the second electronic component 41 is surrounded by the frame 20B. Thus, each second conductive pad 402 can be electrically connected to the corresponding first conductive pad 102 through the corresponding conductor 30. In addition, the method of connecting the first unit 1 and the second unit 2, for example, as follows: respectively printing a plurality of solders S on the top surfaces of the second conductive pads 402, stacking the first unit 1 on the top surface of the second unit 4 through the frame 20B, and then reflowing the solders S, where the conductors 30 can respectively contact the solders S. Hence, each conductor 30 can be electrically connected to each corresponding second conductive pad 402 through each corresponding solder S. The first conductive pads 102 can be electrically connected to the first electronic components 11 through the first circuits (not shown) disposed on the first substrate 10, and the second conductive pads 402 can be electrically connected to the second electronic components 41 through the second circuits (not shown) disposed on the second substrate 40, thus the first electronic component 11 can be electrically connected to the corresponding second electronic component 41 through the corresponding conductor 30.

Referring to FIG. 4, the first embodiment of the instant disclosure can provide a 3D stacked package structure Z through the above-mentioned manufacturing process. The 3D stacked package structure Z comprises a first unit 1, a molding unit 2, a conductive unit 3 and a second unit 4.

First, the first unit 1 includes a first substrate 10 and a plurality of first electronic components 11 disposed on the top surface of the first substrate 10 and electrically connected to the first substrate 10, where the first substrate 10 has a plurality of runners 101 formed on the periphery 100 thereof and passing through the first substrate 10, and the first substrate 10 has a plurality of first conductive pads 102 disposed on the bottom surface of the first substrate 10 and adjacent to the periphery 100 of the first substrate 10. For example, each first electronic component 11 may be a resistance, a capacitance, an inductance, a function chip having a predetermined function or a semiconductor chip having a predetermined function etc.

Moreover, the molding unit 2 includes a top portion 20A disposed on the top surface of the first substrate 10 to cover the first electronic components 11, a frame 20B disposed on the bottom surface of the first substrate 10 and adjacent to the periphery 100 of the first substrate 10, and a plurality of connections 20C respectively disposed inside the runners 101 and concurrently connected between the top portion 20A and the frame 20B. More precisely, the top portion 20A, the frame 20B and the connections 20C can be integrated with each other to form a single piece.

Furthermore, the conductive unit 3 includes a plurality of conductors 30 passing through the frame 20B and respectively electrically connected to the first conductive pads 102. The first unit 1 can be stacked on the second unit 4 through the frame 20B of the molding unit 2, and the first unit 1 can be electrically connected to the second unit 4 through the conductors 30 of the conductive unit 3. The second unit 4 includes a second substrate 40 and a plurality of second electronic components 41 disposed on the top surface of the second substrate 40 and electrically connected to the second substrate 40. In addition, the second substrate 40 has a plurality of second conductive pads 402 disposed on the top surface of the second substrate 40 and adjacent to the periphery 400 of the second substrate 40, each second conductive pad 402 can be electrically connected to each corresponding conductor 30 through each corresponding solder S, and the second electronic components 41 can be surrounded by the frame 20B.

Figure 5:
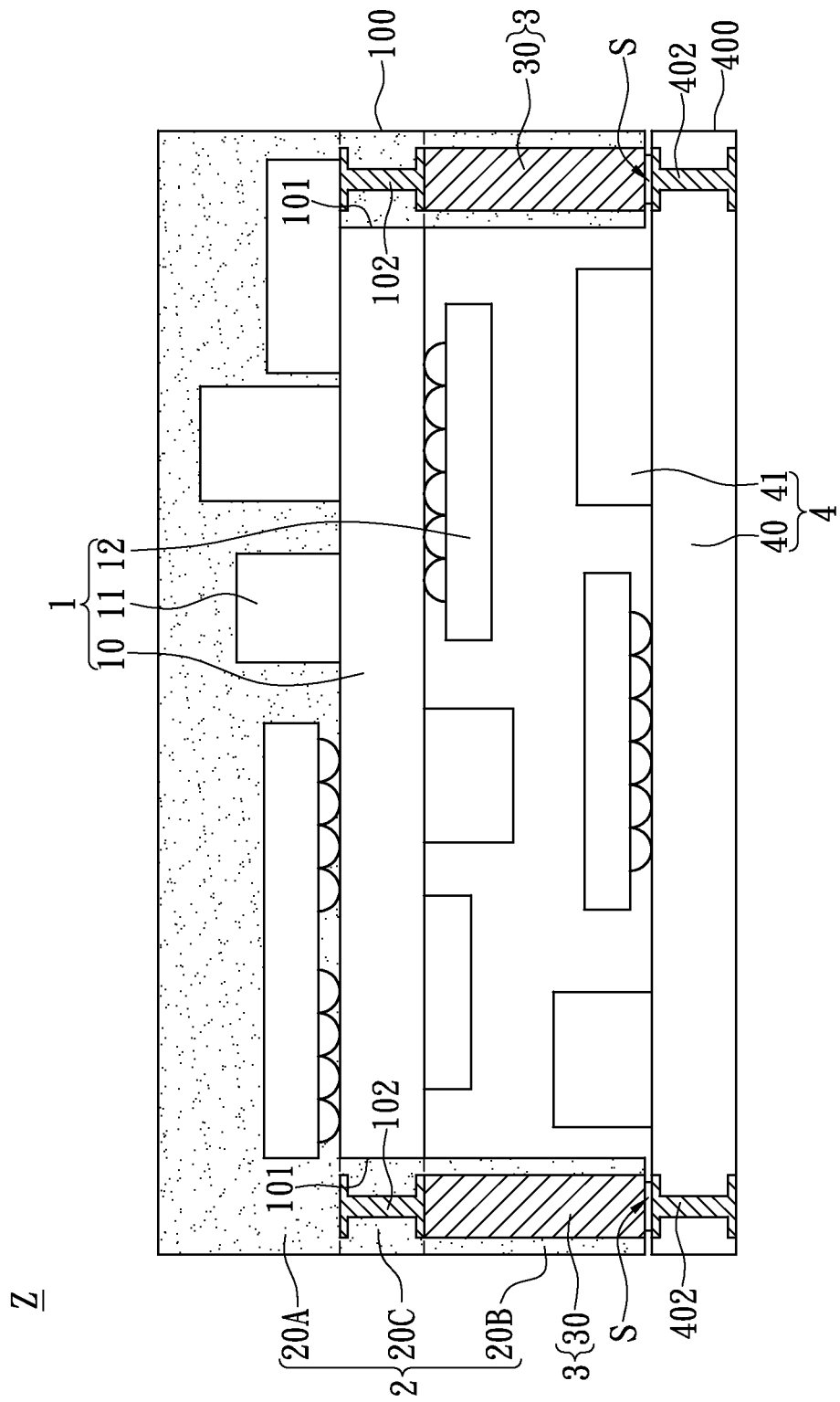
FIG. 5 shows a lateral, schematic view of the 3D stacked package structure according to the second embodiment of the instant disclosure.

Referring to FIG. 5, the second embodiment of the instant disclosure can also provide a 3D stacked package structure Z, comprising a first unit 1, a molding unit 2, a conductive unit 3 and a second unit 4. Comparing FIG. 5 with FIG. 4, the difference between the second embodiment and the first embodiment is as follows: in the second embodiment, the first unit 1 further includes at least one third electronic component 12 disposed on the bottom surface of the first substrate 10 and electrically connected to the first substrate 10, and the third electronic component 12 can be surrounded by the frame 20B. In other words, because the first electronic component 11 and the third electronic component 12 are respectively disposed on the top surface and the bottom surface of the first substrate 10, the component carrying capacity of the first substrate 10 can be increased.

Figure 6A:
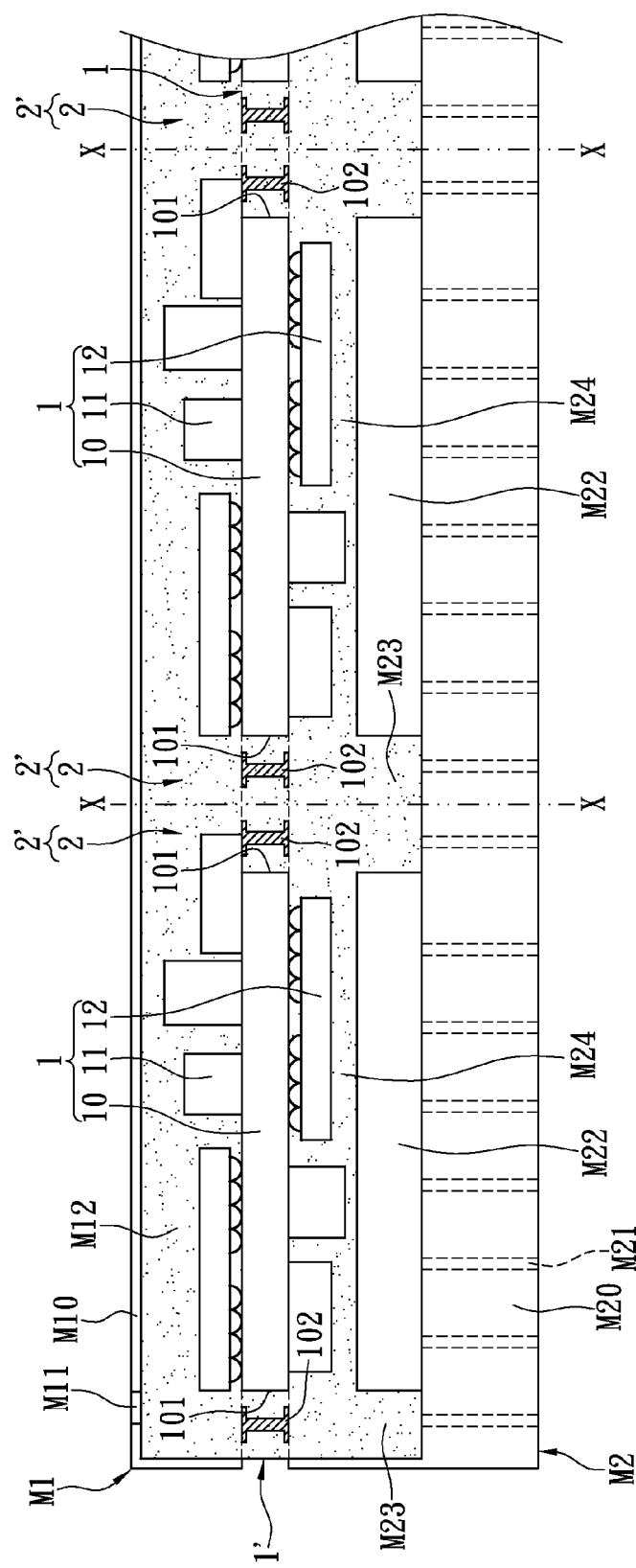
FIG. 6A shows a lateral, schematic view of the circuit substrate module disposed inside another mold structure and filled with the molding material according to the instant disclosure.
Figure 6B:
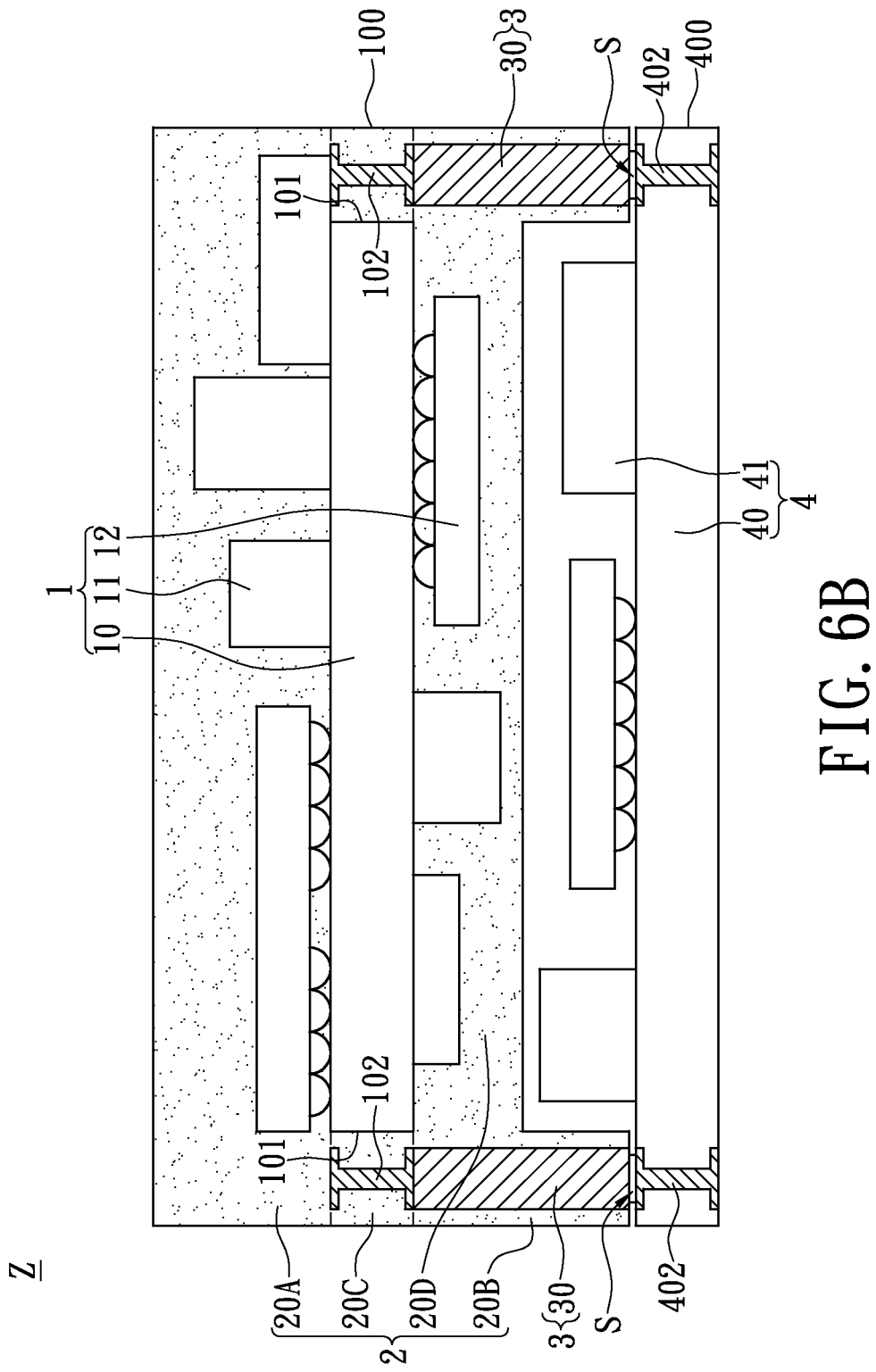
FIG. 6B shows a lateral, schematic view of the 3D stacked package structure according to the third embodiment of the instant disclosure.

Referring to FIG. 6A and FIG. 6B, the third embodiment of the instant disclosure can also provide a 3D stacked package structure Z, comprising a first unit 1, a molding unit 2, a conductive unit 3 and a second unit 4. Comparing FIG. 6A with FIG. 2 and FIG. 6B with FIG. 4, the difference between the third embodiment and the first embodiment is as follows: in the third embodiment, the first unit 1 further includes at least one third electronic component 12 disposed on the bottom surface of the first substrate 10 and electrically connected to the first substrate 10. The bottom mold M2 includes a plurality of flow channels M24 and a plurality of surrounding runners M23 disposed between the bottom casing M20 and the circuit substrate module 1', each flow channel M24 is formed between the corresponding block M22 and the corresponding first substrate 10, and the flow channels M24 and the surrounding runners M23 are communicated with each other. Therefore, because the design of the flow channels M24 of the third embodiment, the molding unit 2 has a bottom sealant 20D formed on the bottom surface of the first substrate 10 for covering the third electronic component 12, and the bottom sealant 20D can be connected to the frame 20B and surrounded by the frame 20B. More precisely, the top portion 20A, the frame 20B, the connection 20C and the bottom sealant 20D can be integrated with each other to form a single piece.

Figure 7:
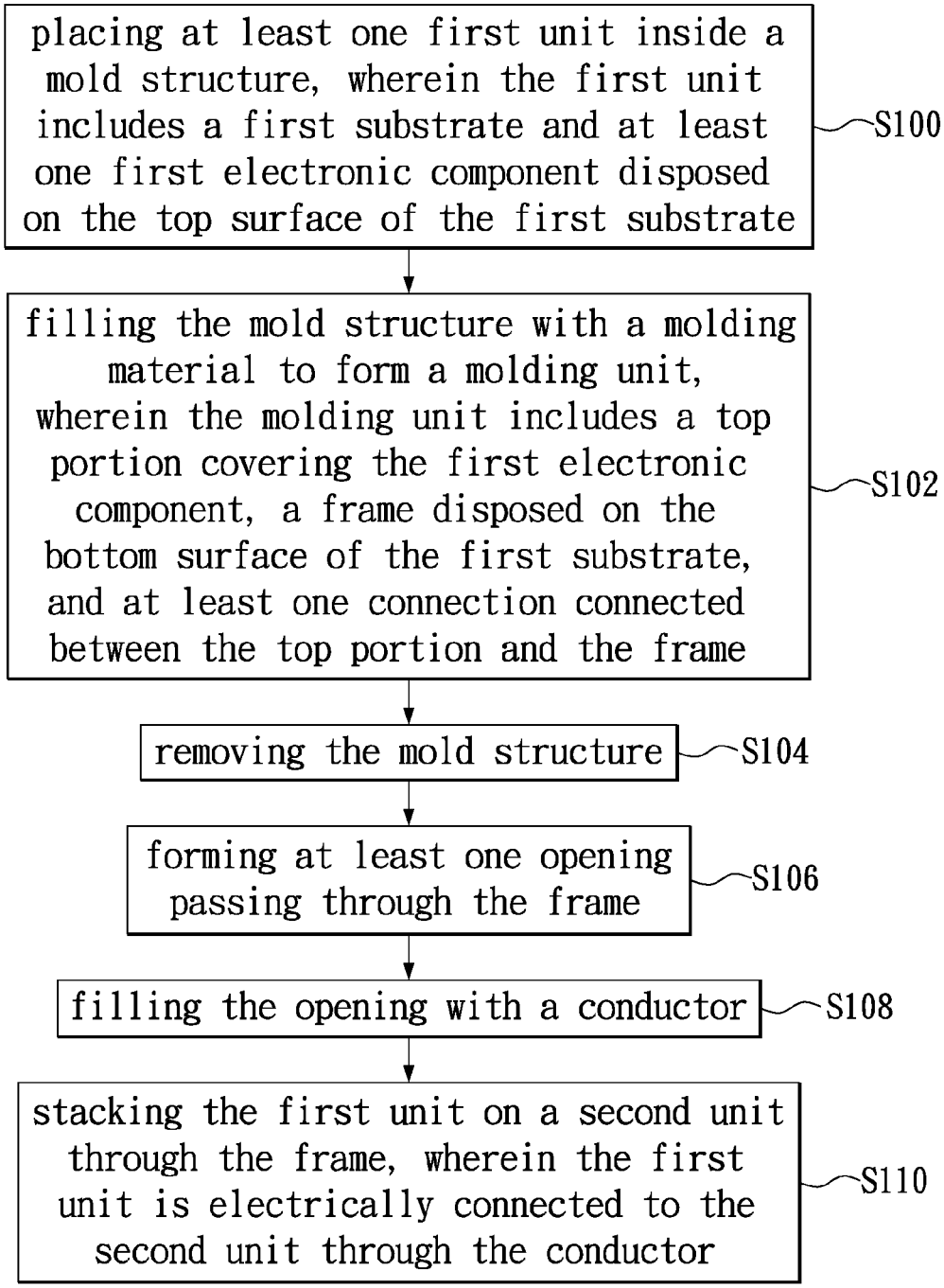
FIG. 7 shows a flowchart of the method of manufacturing the 3D stacked package structure according to the instant disclosure.

Referring to FIG. 7, the instant disclosure provides a method of manufacturing a 3D stacked package structure using at least one first unit as an example, comprising:

The step S100 is that: placing at least one first unit 1 inside a mold structure M, wherein the first unit 1 includes a first substrate 10 and at least one first electronic component 11 disposed on the top surface of the first substrate 10, and the first substrate 10 has at least one first conductive pad 102 and at least one runner 101.

The step S102 is that: filling the mold structure M with a molding material 2' to form a molding unit 2, wherein the molding unit 2 includes a top portion 20A covering the first electronic component 11, a frame 20B disposed on the bottom surface of the first substrate 10, and at least one connection 20C disposed inside the runner 101 and connected between the top portion 20A and the frame 20B.

The step S104 is that: removing the mold structure M.

The step S106 is that: forming at least one opening 200B passing through the frame 20B, wherein the first conductive pad 102 is exposed by the opening 200B.

The step S108 is that: filling the opening 200B with a conductor 30, wherein the conductor 30 is electrically connected to the first conductive pad 102.

The step S110 is that: stacking the first unit 1 on a second unit 4 through the frame 20B, wherein the first unit 1 is electrically connected to the second unit 4 through the conductor 30. More precisely, the step of stacking the first unit 1 on the second unit 4 further comprises electrically connecting the conductor 30 with at least one second conductive pad 402 of the second unit 4 through at least one solder S.

In conclusion, the frame 20B for connecting the first unit 1 with the second unit 4 can be formed conveniently during the step of covering the first electronic component 11 (or the second electronic component 11 and the second electronic component 12) by the top portion 20A, thus the manufacturing process of the instant disclosure can be simplified and the manufacturing cost of the instant disclosure can be reduced.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. A 3D stacked package structure, comprising:
   a first unit including a first substrate and at least one first electronic component disposed on and electrically connected to the first substrate, wherein the first substrate has at least one runner formed on the periphery thereof and passing through the first substrate, and the first substrate has at least one first conductive pad disposed on the bottom surface of the first substrate and adjacent to the periphery of the first substrate;
   a molding unit including a top portion disposed on the first substrate to cover the first electronic component, the top portion extending to an edge of the first substrate, a frame disposed on the bottom surface of the first substrate and adjacent to the periphery of the first substrate, and at least one connection disposed inside the runner and connected between the top portion and the frame;
   a conductive unit including at least one conductor passing through the frame and electrically connected to the first conductive pad; and
   a second unit, wherein the first unit is stacked on the second unit, and the first unit is electrically connected to the second unit through the conductor.

2. The 3D stacked package structure of claim 1, wherein the top portion, the frame and the connection are integrated with each other to form a single piece.

3. The 3D stacked package structure of claim 1, wherein the second unit includes a second substrate and at least one second electronic component disposed on and electrically connected to the second substrate, the second substrate has at least one second conductive pad disposed on the top surface of the second substrate and adjacent to the periphery of the second substrate, and the second conductive pad is electrically connected to the conductor.

4. The 3D stacked package structure of claim 1, wherein the first unit further includes at least one third electronic component disposed on and electrically connected to the first substrate, and the first electronic component and the third electronic component are respectively disposed on the top surface and the bottom surface of the first substrate.

5. The 3D stacked package structure of claim 3, wherein the conductor is electrically connected with the second conductive pad through at least one solder.

6. A 3D stacked package structure, comprising:
a first unit including a first substrate, at least one first electronic component disposed on and electrically connected to the first substrate, and at least one third electronic component disposed on and electrically connected to the first substrate, wherein the first substrate has at least one runner formed on the periphery thereof and passing through the first substrate, and the first substrate has at least one first conductive pad disposed on the bottom surface of the first substrate and adjacent to the periphery of the first substrate;
a molding unit including a top portion disposed on the first substrate to cover the first electronic component, the top portion extending to an edge of the first substrate, a frame disposed on the bottom surface of the first substrate and adjacent to the periphery of the first substrate, at least one connection disposed inside the runner and connected between the top portion and the frame, and a bottom sealant formed on the bottom surface of the first substrate for covering the at least one third electronic component;
a conductive unit including at least one conductor passing through the frame and electrically connected to the first conductive pad; and
a second unit, wherein the first unit is stacked on the second unit, and the first unit is electrically connected to the second unit through the conductor.

7. The 3D stacked package structure of claim 6, wherein the top portion, the frame, the connection and the bottom sealant are integrated with each other to form a single piece.

8. The 3D stacked package structure of claim 6, wherein the second unit includes a second substrate and at least one second electronic component disposed on and electrically connected to the second substrate, the second substrate has at least one second conductive pad disposed on the top surface of the second substrate and adjacent to the periphery of the second substrate, and the second conductive pad is electrically connected to the conductor.

9. The 3D stacked package structure of claim 6, wherein the bottom sealant is connected to the frame and surrounded by the frame.

10. The 3D stacked package structure of claim 6, wherein the conductor is electrically connected with the second conductive pad through at least one solder.

11. A method of manufacturing a 3D stacked package structure, comprising:
placing at least one first unit inside a mold structure, wherein the first unit includes a first substrate and at least one first electronic component disposed on the first substrate, and the first substrate has at least one first conductive pad and at least one runner;
filling the mold structure with a molding material to form a molding unit, wherein the molding unit includes a top portion covering the first electronic component, the top portion extending to an edge of the first substrate, a frame disposed on the bottom surface of the first substrate, and at least one connection disposed inside the runner and connected between the top portion and the frame;
removing the mold structure;
forming at least one opening passing through the frame, wherein the first conductive pad is exposed by the opening;
filling the opening with a conductor, wherein the conductor is electrically connected to the first conductive pad; and
stacking the first unit on a second unit through the frame, wherein the first unit is electrically connected to the second unit through the conductor.

12. The method of claim 11, wherein the second unit includes a second substrate and at least one second electronic component disposed on the second substrate, and the second electronic component is surround by the frame.

13. The method of claim 11, wherein the step of stacking the first unit on the second unit further comprises: electrically connecting the conductor with at least one second conductive pad of the second unit through at least one solder.

14. The method of claim 11, wherein the step of filling the mold structure with the molding material further comprises: pouring the molding material into the mold structure through a port of the mold structure, wherein bubbles generated by the pouring step are discharged from a plurality of exhaust runners of the mold structure.

15. The method of claim 11, wherein the opening is formed by laser drilling.

16. The method of claim 11, wherein the first unit further includes at least one third electronic component disposed on and electrically connected to the first substrate.

17. The method of claim 16, wherein the first electronic component and the third electronic component are respectively disposed on the top surface and the bottom surface of the first substrate.

18. The method of claim 16, wherein the molding unit includes a bottom sealant formed on the bottom surface of the first substrate for covering the at least one third electronic component.

19. The method of claim 18, wherein the bottom sealant is connected to the frame and surrounded by the frame.

20. The method of claim 18, wherein the top portion, the frame, the connection and the bottom sealant are integrated with each other to form a single piece.

* * * * *